United States Patent [19]

Bragas

[11] Patent Number: 4,476,581
[45] Date of Patent: Oct. 9, 1984

[54] FM RECEIVER WITH SUBCARRIER DECODING CIRCUIT

[75] Inventor: Peter Bragas, Hildesheim, Fed. Rep. of Germany

[73] Assignee: Blaupunkt Werke GmbH, Hildesheim, Fed. Rep. of Germany

[21] Appl. No.: 415,431

[22] Filed: Sep. 7, 1982

[30] Foreign Application Priority Data

Nov. 3, 1981 [DE] Fed. Rep. of Germany ....... 3143468

[51] Int. Cl.$^3$ .......................... H04B 1/16; H03J 7/20
[52] U.S. Cl. .................................... 455/166; 455/45; 455/228
[58] Field of Search ................... 455/161, 166, 32, 36, 455/37, 45, 62, 205, 228, 194; 370/11

[56] References Cited

U.S. PATENT DOCUMENTS

| | | | |
|---|---|---|---|
| 2,361,653 | 10/1944 | Roberts | 455/228 |
| 3,534,266 | 10/1970 | Halstead | 455/45 |
| 3,535,636 | 10/1970 | Muilwijk | 455/32 |
| 3,840,811 | 10/1974 | Blouch | 455/32 |
| 4,009,442 | 2/1977 | Von Brömssen | 455/166 |
| 4,181,887 | 1/1980 | Place | 455/36 |
| 4,392,248 | 7/1983 | Eckels et al. | 455/161 |

*Primary Examiner*—Marc E. Bookbinder
*Attorney, Agent, or Firm*—Frishauf, Holtz, Goodman & Woodward

[57] ABSTRACT

To prevent loss of information during an announcement in a traffic or announcement recognition system in which, during radiation of an announcement, a subcarrier is modulated to a lesser degree by a radio station or region recognition frequency (RR) but to a higher degree by an announcement recognition (AR frequency) during an announcement only, and a logic circuit is included in the announcement decoder which recognizes (1) presence of an RR signal to tune the receiver to the station radiated, and
(2) presence of an AR signal, the presence of the AR signal being sensed and utilized to inhibit re-tuning of the receiver even though the previously detected RR signal may no longer be detected by the receiver.

9 Claims, 3 Drawing Figures

000000000
FM RECEIVER WITH SUBCARRIER DECODING CIRCUIT

The present invention relates to an FM receiver and more particularly to an FM receiver suitable to demodulate frequency modulated audio intelligence information, but also to recognize control signals which are frequency modulated on the carrier wave, and additionally audio modulated to provide control outputs.

BACKGROUND

The referenced application Ser. No. 06/319,655, filed Nov. 9, 1981, of which the inventor hereof is a co-inventor, describes an FM receiver which has a frequency demodulator for the carrier signals and the audio intelligence information modulated thereon, as well as a detector for a 57 kHz auxiliary carrier which is amplitude modulated, the receiver including an amplitude demodulator for the amplitude modulation of the 57 kHz subcarrier. The additional filtering circuit and demodulation circuit for the amplitude demodulation of the 57 kHz subcarrier is utilized to recognize the subcarrier which is radiated by some radio stations, capable of providing special announcements, for example of traffic conditions, sports programs, or the like. For details, the referenced Hegeler patent, and the applications are referred to. The modulation on the subcarrier can provide recognition of a predetermined radio station, or region, hereinafter RR signals, which are separate from the audio program being provided by the station on the main carrier. In the time during which a special announcement is being radiated, the auxiliary 57 kHz subcarrier can be modulated by a different, or additional announcement recognition frequency, hereinafter the AR signal. The transmitter, thus, by radiating suitable signals can control switching within the receiver, so that the receiver will be capable of reproducing the radiated program, based on a geographical region, a specific transmitter, specific announcements, and the like. The radio station recognition can be identified by certain and predetermined modulating frequencies on the auxiliary subcarrier. The amplitude modulation of the auxiliary subcarrier to characterize or recognize a specific station can be in the range of between 20 to 60 Hz, or somewhat higher.

The referenced application Ser. No. 06/319,653, filed Nov. 9, 1981, of which the inventor hereof is a co-inventor, describes a system in which the 57 kHz auxiliary subcarrier is modulated during the duration of an announcement by the announcement recognition, or AR signal with a modulation degree of about 60%, whereas the modulation degree to recognize a certain radio station, or region, that is the RR signal modulation, is then provided at a level of 30%. In the interval between announcements, however, when no announcement is being radiated, the modulation degree of the 57 kHz auxiliary subcarrier by the RR signal frequency is raised to about 60%.

Decreasing the extent of modulation by the RR signal during the period of time that the AR signal is being radiated—with the 60% modulation at its frequency, may cause loss of recognition of the RR signal in the receiver if the geographic distribution between the transmitter and the specific receiver—typically installed in an automotive vehicle—is such that the particular transmitter is being received at only low field signal strength. The modulation degree of 30%, then, may no longer be sufficient to provide the requisite recognition signal strength within the receiver.

It is known to provide receivers with signal-searching apparatus, and such receivers may, additionally, be constructed to respond to the auxiliary subcarrier when modulated with an RR signal. Difficulties may arise in such signal-seeking or scanning or panoramic receivers if the degree of modulation of 30% by the RR signal occurs under conditions of low signal strengths.

THE INVENTION

It is an object to prevent spurious signal search operations in signal-search receivers tuned to an announcement under low signal strength conditions.

Briefly, loss of reception during presence of an AR signal, and while the region or radio station recognition (RR signal) is of reduced modulation is prevented by providing a logic circuit to the receiver connected to the tuning stage thereof and controlling station change based on logical combination of the presence of an RR signal and the absence of an AR signal, or the respective inverse of the signals.

The system has the advantage that, if the RR signal has caused a signal search receiver to be tuned to a particular station and then the modulation degree is dropped because a AR signal is being broadcast, thus indicative that the audio modulation of the transmitter is used to broadcast an announcement, a new search cycle is inhibited, which might interrupt the reproduction of the particular announcement then being broadcast. Experience has shown that the listener or operator, particularly if the receiver is an automobile radio, is prepared to accept decrease in reproduction quality or clearness of intelligibility of the announcement, even if the field strength of the received signal should drop, but will not accept complete interruption of an announcement—which may relate to traffic or emergency conditions. The receiver, thus, is so arranged in accordance with the invention by inclusion of the logic stage that, during radiation of an AR signal, drop-out of recognition of the RR signal will not lead to detuning of the receiver, but permit continued reproduction of the announcement during the persistence of the AR signal.

DRAWINGS

DETAILED DESCRIPTION

Figure 1:
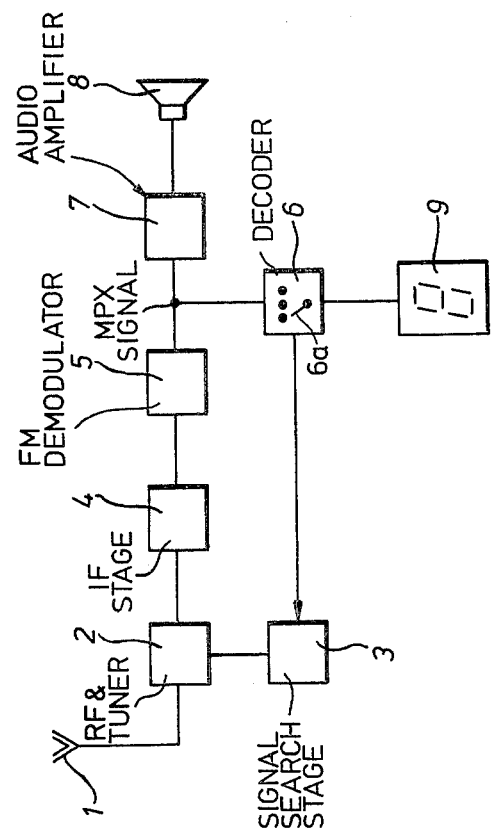
FIG. 1 is a schematic block diagram of an FM receiver constructed in accordance with the present invention.

An input signal is applied from antenna 1, FIG. 1, to the RF stage 2, which includes a tuner. The tuner can be operated manually or by a signal search stage 3. Connected to the RF stage and tuner is an intermediate frequency (IF) stage 4, which, in turn, is connected to a frequency modulation (FM) detector 5, for example a ratio detector, operating as a frequency demodulator. The intelligence information radiated by the transmitter is available from the FM demodulator 5 in form of an MPX signal.

The 57 kHz subcarrier is filtered in the announcement recognition 6 and evaluated therein. The audio amplifier 7 amplifies the audio frequency program content for reproduction by loudspeaker 8. The announcement decoder 6 provides an output to the signal search stage 3 to control the signal search stage to lock into transmitters which:

(a) radiate the 57 kHz subcarrier, and
(b) modulate the subcarrier by a predetermined modulating frequency, selectable by a selector switch 6a forming part of or connected to the decoder. The particular selected channel, determined by a RR frequency, is indicated by indicator 9.

Figure 2:
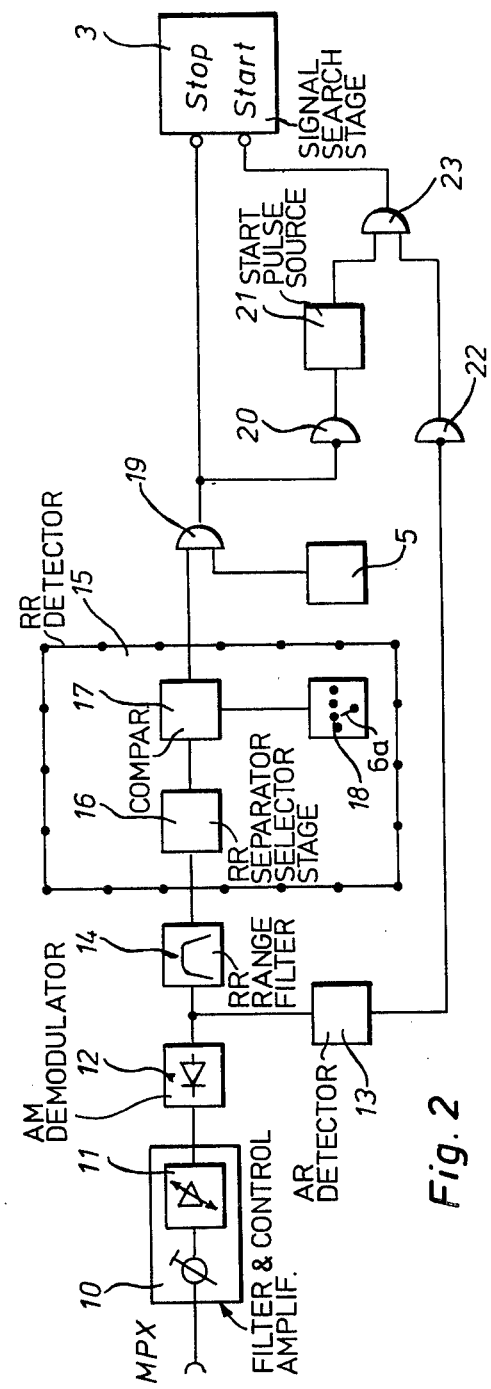
FIG. 2 is a sehcmatic block diagram of an announcement radiation decoder, controlling a signal search stage.

The decoder 6 is illustrated in detail in FIG. 2. The output from FM demodulator, that is, the intelligence modulation MPX, is applied to a 57 kHz detector 10 which includes a filter and a control amplifier 11, the filter filtering the 57 kHz subcarrier. The control amplifier 11 has a long time constant with respect to amplitude of the auxiliary carrier. Such control amplifiers are well known. The time constant thereof is substantially longer than the cycling duration of the lowest modulation frequency of the auxiliary carrier, and may, for example, be one second or more. The detector 10 is connected to an amplitude demodulator 12, the output of which provides the entire modulating spectrum of the auxiliary 57 kHz subcarrier.

The modulation impressed on the 57 kHz subcarrier, during an anouncement, includes a AR modulation, for example of 125 Hz, and a further modulation with a frequency, e.g., less than 125 Hz, forming the RR signal, to recognize a certain radio station or region. The AR signal modulates the auxiliary 57 kHz subcarrier by 60%, for example, the RR signal modulates the auxiliary subcarrier during occurrence of the announcement by 30%. In the interval between announcements, that is, when no AR signal is being radiated, the RR signal modulates the 57 kHz auxiliary subcarrier by a modulation degree of 60%.

Other frequencies than the frequencies mentioned herein, and other degrees of modulation may be selected. The present invention is directed, however, to systems and methods in which the modulation of the 57 kHz auxiliary subcarrier by the region or radio station recognition signal, that is, the RR signal, is lowered or decreased during presence of the AR or announcement recognition signal to an extent which, under unfavorable reception conditions, may cause ambiguity in decoding of the RR signal.

An AR detector 13 is connected to the output of AM demodulator 12. The AR detector includes a filter which is specifically tuned to the AR frequency. The output of the amplitude demodulator 12 additionally is connected to a bandpass filter 14 having low-pass characteristics which cover the entire frequency spectrum within which RR signals may be expected or may occur. The upper limiting frequency of the RR range filter 14 thus must be above the frequency of the highest RR signal, or correspond thereto.

An RR detector 15 is connected to filter 14. The RR detector includes a region or radio station recognition separator 16 in which the frequency of the RR signal of the receiver, to which the tuner 2 (FIG. 1) is then tuned, is determined. This frequency is compared in comparator 17 with a predetermined RR selected channel as selected by selector stage 18, which includes the selector switch 6a.

The output of comparator 17 is connected to an AND-gate 19 which, in turn, is connected to the stop input of the signal search stage 3. A second input to the AND-gate is connected to the output of an FM demodulator 5 to apply an enabling input thereto if the receiver is tuned to a station of sufficient signal strength to warrant reception. Signal search systems of this type are well known and can be constructed in accordance with any suitable design.

The output of the gate 19 is, additionally, connected to the input of an inverter 20, which is connected to the input of a start pulse source 21 for the signal search stage 3. As soon as the receiver no longer provides a suitable signal capable of being adequately reproduced with selected fidelity, the output signal from ratio detector 5 will fail and hence no output signal from AND-gate 19 will be provided. Inverter 20 thus will then cause the start pulse source 21 to initiate a further signal search for a suitable receiver. If the receiver can be tuned, regardless of the presence of an RR signal, the switch 6a can be set to a suitable control point so that the comparator 17 will provide a continuous enabling signal to the gate 19.

Let it be assumed that the transmitter to which the station is tuned radiates an announcement. If the field strength, then, at the particular receiver will drop, but the receiver can still provide suitable output reception, the FM demodulator 5 will continue to provide the stop signal. Yet, because of the weakening of the signal, the output from comparator 17 may fail and thus the conjunctive conditions at the input of the AND-gate 19 may no longer pertain. Consequently, the start pulse source 21 would be enabled, and a new signal search cycle would start. This, of course, would interrupt the announcement, and the listener would not receive the intelligence content.

In accordance with a feature of the invention, initiation of a new search cycle is inhibited if an announcement is present, although the region recognition may fail. An output from the AR detector 13 is applied through an inverter 22 to an AND-gate 23, the second input of which is connected to the start pulse source 21, the AND-gate being interposed between the start pulse source 21 and the signal search start terminal.

OPERATION

The conjunctive conditions of the AND-gate 23 and the inverter 22 permit transfer of a start pulse to the signal search stage if, and only if, an AR signal is absent. Consequently, if an announcement is being radiated by the transmitter, received, and reproduced by the loudspeaker 8, it will not be interrupted even though the RR signal may fail.

The time constants which are inherent in the circuits for recognition of an announcement and for determining for recognition of a region or radio station have not been particularly described or stressed herein. These time constants are comparatively long and are so set that short-time interruption or brief drop-outs due to instantaneous drops of the field strengths of the received transmitter do not become effective. The system and circuit in accordance with the present invention is directed, not, to instantaneous or short-time drop-outs, but rather to continued, long-time decrease in field strength with respect to the effect on the determination of the recognition of a specific radio station or region. Thus, gradual loss of field strength with respect to region or radio station recognition is compensated. Yet, it is not necessary to remain tuned to a specific radio station in a specific region if the transmitter to which the receiver was tuned can be received only weakly or marginally; thus, after the announcement is terminated, a new signal search cycle can be initiated.

It is known to construct FM receivers such that the sensitivity of the input, or RF stage, is changed during a signal search cycle. Usually, the sensitivity of the input stage is decreased. Other types of FM receivers are provided in which the sensitivity of the input stage is increased after a search cycle has terminated if, upon a first run-through of the entire frequency band, no receiver was captured which had the requisite signal strength. Apparatus of this type is capable of capturing a receiver which has become weaker, and thus which had been tuned out, since the new criteria for reception have been met. Such a system, however, by itself cannot inhibit interruption of the reproduction of any announcement which then was being radiated. Thus, the purpose of the present invention, to hold the receiver tuned while an announcement is being radiated, is not met by receivers in which the sensitivity of the input stage is changed as a result of, and a function of search cycles.

Figure 3:
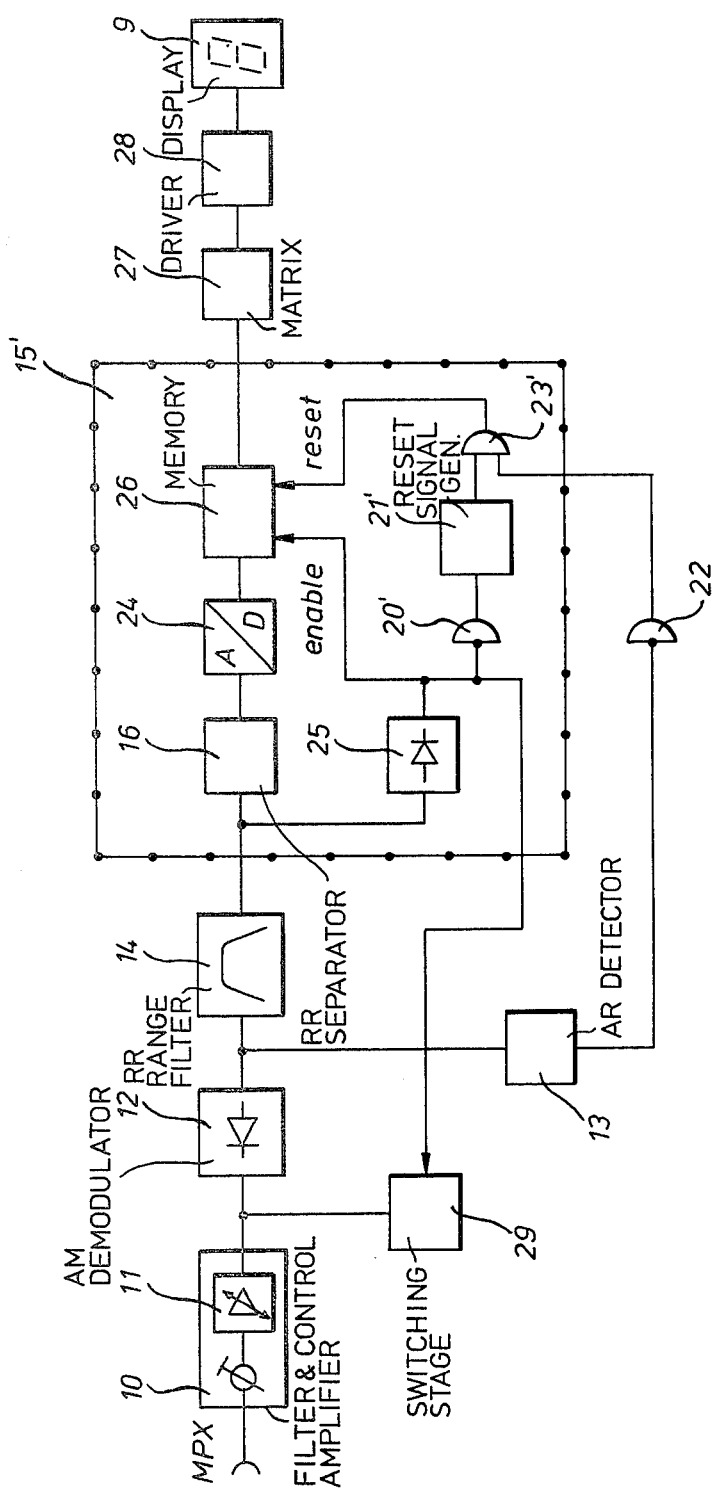
FIG. 3 illustrates a decoder having a radio station or region recognition indicator.

The decoder to indicate the particular radio station or region recognition is shown in FIG. 3.

The intelligence modulation MPX derived from the ratio detector 5 (FIG. 1) is filtered in the filter and control amplifier stage 10,11 (FIG. 2) in order to derive the 57 kHz auxiliary subcarrier with its amplitude modulation. The output signal is applied to the AM demodulator 12, the RR range filter 14 and to an RR separator 16 of a RR detector 15'. The output signal from the amplifier 11, as demodulated, is additionally connected to a switching stage 29 which directly evaluates the presence of the 57 kHz auxiliary subcarrier.

In accordance with a feature of the invention, the RR detector 15' utilizes an analog/digital converter 24, connected to the RR separator 16. A rectifier 25 is connected in parallel to the input of the RR separator 16.

A memory 26 is connected to the A/D converter 24 to store the RR signal, in digital form. Storage of the RR signal in the memory is initiated as soon as the output of the rectifier stage 25 provides a suitable signal to the "enable" input of the memory 26, that is, opens the memory 26 for receipt of information. The memory content of the memory 26 is then applied to a matrix 27. The matrix 27 is connected to a driver stage 28 which, in turn, is connected to the RR indicator or display 9, to display, for example by numeral, a specific RR channel or station.

Rectifier 25 provides an output signal as soon as any RR demodulation of sufficient amplitude is sensed. If this output signal is missing, however, the inverter 20' will provide a signal to the reset pulse source 21' in order to reset the memory 26 to zero or null. Resetting, in accordance with a feature of the present invention may occur, however, only if generation of a reset pulse is permitted by an enabling input on the second input connection of an AND-gate 23' interposed between the reset signal generator 21' and the reset terminal memory 26. The AND-gate 23' receives its enabling signal from the AR detector 13 via the inverter 22 (see FIG. 2). The signal applied to AND-gate 23' from the inverter 22, due to the inversion, permits transmission of the reset signal from the reset signal generator 21 only if no AR signal is present.

The output of the rectifier stage 25 can be connected, further, to a switching stage 29, to disable the switching stage 29. Switching stage 29 is connected between the filter and control amplifier 10, 11, and the AM demodulator 12, and can disable the chain of elements 12-14-16-24-26-27-28 to avoid erroneous indication of the display 9.

The signal search system described in connection with FIG. 2 may be used in combination with the decoder 6 of FIG. 1; likewise, the particular indicator and display circuitry illustrated in FIG. 3 can be used with the decoder of FIG. 1, selectively, or solely. Of course, both the systems of FIGS. 2 and 3 can be used together, with those elements which are common to the two systems being provided, structurally, only once. The illustrations of FIGS. 2 and 3 include duplications for purposes of clarity in connection with explanation of the operation, Various changes and modifications may be made and features described in connection with any one of the embodiments may be used with any of the others, within the scope of the inventive concept.

I claim:

1. Frequency modulated (FM) receiver to receive FM signals including audio signals which are frequency modulated on a carrier and have a band width defining an audio band, and including an auxiliary subcarrier (57 kHz) which is, selectively, amplitude modulated (AM) with (1) a first signal (RR) representing a radio station or region signal and indicative that the particular station to which the receiver is tuned is capable of broadcasting announcements, and (2) a second signal (AR) which is broadcast when the announcement is actually being radiated over the audio band of the FM signal, and wherein, during modulation of the auxialiary subcarrier by the second signal (AR), the degree of modulation by the first signal (RR) is reduced with respect to modulation by the first signal (RR) in the absence of modulation by the second signal (AR).

said receiver having an FM demodulator (5) for demodulating the carrier and deriving the auxiliary AM subcarrier and the audio signal;

subcarrier filter means (10, 11) coupled to the FM demodulator for passing the auxiliary AM subcarrier and blocking the audio signal a filtered auxiliary subcarrier signal;

an AM demodulator for demodulating the passed AM subcarrier;

AR filter means (13) tuned to the frequency of the second signal (AR) coupled to the AM demodulator and deriving an AR signal when it is being modulated on the auxiliary subcarrier;

and first filter means (14, 16, 17, 18) coupled to the AM demodulator and tuned to a selected first RR frequency and deriving an RR signal, said receiver further comprising, means for preventing loss of reception from a radio station which is radiating the FM signal including the auxiliary subcarrier, modulated by the first signal (RR), and while the RR signal modulation degree reduces by preventing re-tuning of the receiver to a different radio station, including a logic circuit (22, 23) coupled to a tuning stage (2, 3) of the receiver and coupled to said AR filter means and said first filter means for selective prevention of station change of the receiver due to re-tuning of the receiver to a different radio station, said logic circuit (22, 23) being logically responsive to (a) presence or absence of an RR signal; and
(b) presence of an AR signal to perform said station change prevention.

2. Receiver according to claim 1, wherein said logic circuit comprises an AND-gate (23) connected to respond to a signal representative of the RR signal as one logic input and to receive an AR signal via an inverting means as another logic input, said logic circuit having its output connected to the tuning stage (2,3) of the receiver, and permitting detuning of the receiver only upon fulfillment of the logic conditions:
(a) presence or absence of an RR signal; and
(b) absence of an AR signal
to prevent detuning of the receiver upon presence of an AR signal regardless of presence or absence of the RR signal.

3. Receiver according to claim 1, including indicator means (9) connected to the output of the logic circuit (22,23) and displaying an indication representative of a transmitter characterized by a specific frequency of said first (RR) signal;
said logic circuit retaining the indicator means in the display mode of the specific frequency during presence of an AR signal regardless of failure of continued presence of an RR signal.

4. Receiver according to claim 1, wherein said tuning stage comprises a signal search stage (3), and the output of the logic circuit is connected to a start or search input of said signal search stage.

5. Receiver according to claim 2, wherein said tuning stage comprises a signal search stage (3), and the output of the AND-gate (23) is connected to a start, or search input of said signal search stage to enable the signal search stage to search for another station only upon absence of the AR signal.

6. Receiver according to claim 3, further including a memory (26) connected to said indicator means (9), said memory having an "enable input" connected to be controlled by the RR signal, and a RESET input connected to the output of the logic circuit.

7. Receiver according to claim 3, wherein said logic circuit comprises an AND-gate (23) connected to respond to a signal representative of the RR signal as one logic input and to receive the inverted AR signal as another logic input, said logic circuit having its output connected to the tuning stage (2,3) of the receiver, and permitting detuning of the receiver only upon fulfillment of the logic conditions:
(a) presence or absence of an RR signal; and
(b) absence of an AR signal
to prevent detuning of the receiver upon presence of an AR signal regardless of presence or absence of the RR signal;
further including a memory (26) connected in advance of said indicator means (9), said memory having an "ENABLE" input connected to be controlled by said RR signal and a "RESET" input connected to the output of said AND-gate to permit change of displayed indication by said indicator means only upon absence of said AR signal.

8. Method of preventing drop-out of an announcement reproduction being broadcast by an FM transmitter, and received by an FM receiver,
wherein said FM receiver is a tunable receiver and receives FM signals, including audio signals which are frequency modulated on a carrier and have a band width defining an audio band, and including an auxiliary subcarrier which is, selectively, amplitude modulated (AM) with a first signal (RR) of a first predetermined frequency representing a radio station or region recognition signal, and indicative of a particular radio station which is capable of carrying broadcast announcements, and a second signal (AR) of a second predetermined frequency which is broadcast when the announcement is actually being radiated by the specific transmitter over the audio band of the FM signals thereof, and wherein, during modulation of the auxiliary subcarrier by the second signal (AR), the degree of modulation by the first signal (RR) is reduced with respect to modulation by the first signal (RR) in the absence of modulation by the second signal (AR),
including the steps of
tuning said receiver to receive said frequency modulated carrier including audio signals and the amplitude modulated subcarrier;
frequency demodulating the FM carrier to provide said audio signals and AM subcarrier;
filtering the auxiliary subcarrier and audio signals to block the audio signals and pass said auxiliary subcarrier signal;
amplitude demodulating the auxiliary subcarrier;
filtering the demodulated auxiliary subcarrier with respect to the first predetermined frequency of the first signal (RR) to derive an RR signal;
filtering the demodulated auxiliary subcarrier with respect to the second predetermined frequency of the second signal to derive an AR signal, when it is being modulated or said subcarrier;
logically combining the AR signal and the RR signal to derive a control signal having a first characteristic in dependence on:
(a) presence or absence of the RR signal; and
(b) presence of the AR signal;
and having a second characteristic in dependence on:
(a) presence or absence of the RR signal and;
(b) absence of the AR signal; preventing re-tuning of the receiver when the control signal he said first characteristic and permitting re-tuning of the receiver when the control signal has said second characteristic, respectively.

9. Method according to claim 8, wherein said tuning step includes a signal search step and said method further comprises
inhibiting start of a signal search cycle upon detection of an AR signal, regardless of continued detection of the RR signal.

* * * * *

UNITED STATES PATENT AND TRADEMARK OFFICE
CERTIFICATE OF CORRECTION

PATENT NO. : 4,476,581
DATED : October 9, 1984
INVENTOR(S) : Peter BRAGAS

It is certified that error appears in the above-identified patent and that said Letters Patent is hereby corrected as shown below:

Claim 8, column 8, line 50 change "he" to -- has --

Claim 7, column 7, line 46 change to read as follows:
 -- logic input and to receive an AR signal via an invertins means as --

Signed and Sealed this

Seventh Day of May 1985

[SEAL]

Attest:

DONALD J. QUIGG

Attesting Officer     Acting Commissioner of Patents and Trademarks